(12) United States Patent  
Zhu

(10) Patent No.: US 6,509,736 B2
(45) Date of Patent: Jan. 21, 2003

(54) METHOD FOR MRI DATA ACQUISITION AND RECONSTRUCTION WITH MINIMAL LATENCY

(75) Inventor: Yudong Zhu, Clifton Park, NY (US)

(73) Assignee: General Electric Company, Schenectady, NY (US)

(*) Notice: Subject to any disclaimer, the term of this patent is extended or adjusted under 35 U.S.C. 154(b) by 0 days.

(21) Appl. No.: 09/728,223

(22) Filed: Nov. 30, 2000

(65) Prior Publication Data

US 2001/0038285 A1 Nov. 8, 2001

Related U.S. Application Data

(60) Provisional application No. 60/168,124, filed on Nov. 30, 1999, and provisional application No. 60/168,125, filed on Nov. 30, 1999.

(51) Int. Cl.$^7$ .............................................. G01V 3/00
(52) U.S. Cl. ............................. 324/309; 324/307
(58) Field of Search .............................. 324/300, 306, 324/307, 312, 314, 309, 318

(56) References Cited

U.S. PATENT DOCUMENTS

| | | | |
|---|---|---|---|
| 4,651,095 A | | 3/1987 | Eastwood et al. ............ 324/307 |
| 4,830,012 A | | 5/1989 | Riederer ...................... 128/653 |
| 4,958,282 A | | 9/1990 | Barjhoux ................ 364/413.13 |
| 5,164,671 A | | 11/1992 | Goldberg ..................... 324/309 |
| 5,275,164 A | | 1/1994 | Maeda et al. ............. 128/653.2 |
| 6,097,977 A | * | 8/2000 | Collick et al. .............. 128/922 |
| 6,278,273 B1 | * | 8/2001 | Riederer et al. ............ 324/306 |
| 6,320,378 B1 | * | 11/2001 | Maier et al. ................ 324/307 |

* cited by examiner

Primary Examiner—Louis Arana
(74) Attorney, Agent, or Firm—Jean K. Testa; Jill M. Breedlove

(57) ABSTRACT

A computationally efficient and latency-minimized method of data acquisition and reconstruction for use with a Magnetic Resonance Imaging (MRI) system comprises traversing acquired k-space data in a plurality of segments and computing sub-images for each of the segments. Thereafter, the sub-images are incrementally summed to form intermediate images for use in monitoring and diagnosis in said MRI system.

9 Claims, 5 Drawing Sheets

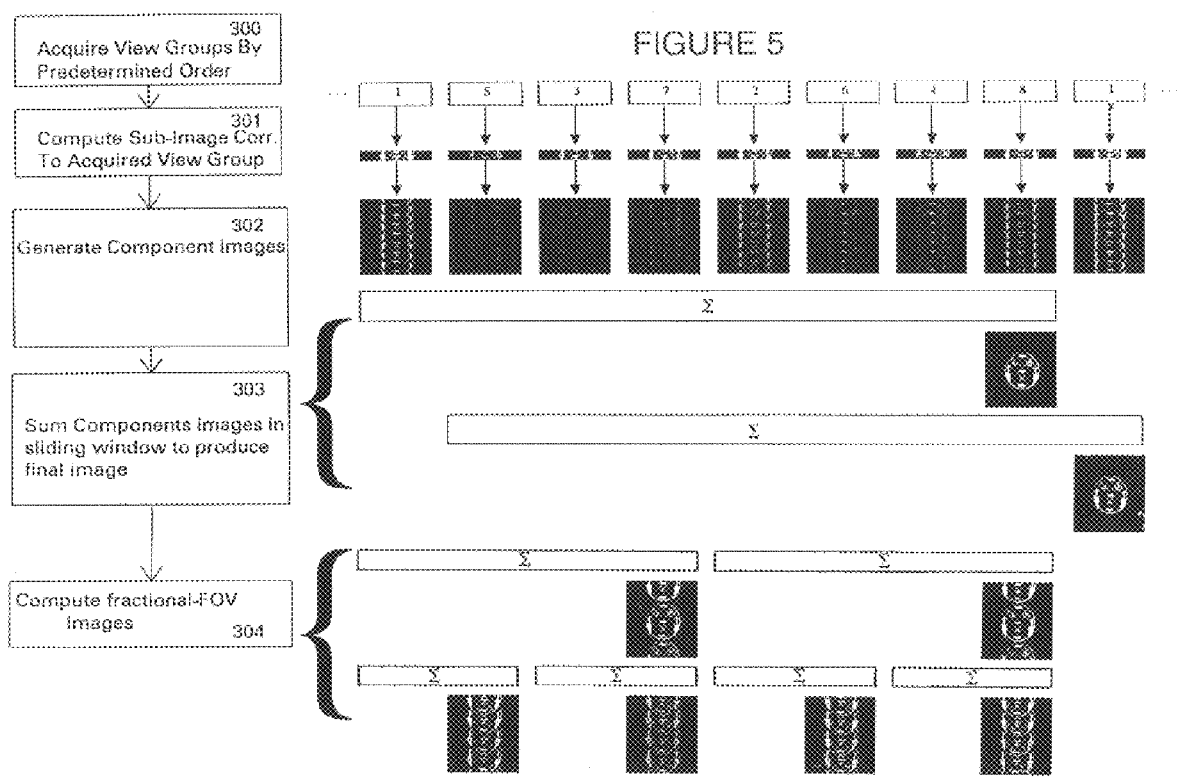

METHOD FOR MRI DATA ACQUISITION AND RECONSTRUCTION WITH MINIMAL LATENCY

This application is related to Provisional Applications U.S. Ser. No. 60/168,124 and U.S. Ser. No. 60/168,125, both filed Nov. 30, 1999 in the U.S. Patent and Trademark Office, the contents of which are incorporated herein by reference, and the benefit of priority to which is claimed under 35 U.S.C. 119(e).

BACKGROUND OF THE INVENTION

This invention relates to magnetic resonance imaging (MRI) systems and more particularly to such systems used for acquiring data and reconstructing data for two- or three-dimensional images.

Magnetic Resonance imaging (MRI) involves acquiring data in the spatial frequency domain referred to as k-space, and transforming the data into the spatial domain prior to viewing. The acquired k-space data samples have both magnitude and phase components. The Fourier transform of the k-space data is the MRI image.

Cartesian sampling in k-space followed by inverse discrete Fourier transform (IDFT) represents a commonly-used magnetic resonance imaging scheme. While the IDFT reconstruction is generally realized using the well-known and highly efficient fast Fourier transform (FFT) algorithm, reconstruction latency can still be significant. Reconstruction latency refers to the interval from the time of data acquisition to the time of actual visualization of the corresponding image.

With a modern MR imaging system run in gated time-resolved, interleaved multi-slice or volumetric imaging mode, depending on the data set size the latency may be on the order of tens of seconds, which may seriously hamper the use of the system for real-time or concurrent monitoring and diagnosis. The conventional practice of separating the FFT-reconstruction from the acquisition of a complete set of k-space samples is a main contributor to the latency. Further, the problem is generally aggravated when spatiotemporal coverage/resolution increases, because the time required to complete an FFT increases as the number of data points increase.

With the MR system run in fluoroscopy mode, the reconstruction latency degrades the system's real-time performance and leads to low image frame rate. In this case, computation redundancy may be another major contributor to the latency. To achieve a smoother depiction of imaged dynamics for example, the known technique of sliding-window reconstruction attempts to increase the number of reconstructed images through sharing raw data between reconstructed images. When this technique is applied in Cartesian-sampling based MR fluoroscopy, data acquisition constantly loops through the phase encodes, resulting in a fully refreshed k-space data frame every $T_{traverse}$ seconds ($T_{traverse}$=time required for a complete k-space traversing). Image reconstruction, on the other hand, repeatedly applies FFT to a sliding window of the most recent full set of phase encodes, producing an image every $T_{compute}$ seconds ($T_{compute}$=time required for the FFT computation). While $T_{traverse}$ determines the temporal resolution of the fluoroscopic images, $T_{compute}$ determines the upper limit of the rate at which one can slide the reconstruction window and hence the frame-rate of the fluoroscopic images. The fluoroscopy's real-time performance will thus be degraded if the FFT's are carried out slowly, because not only will the latency be significant, but also will the frame-rate be low. What is needed is further efficiency in reconstructing images to further cut down acquisition-to-visualization latency. Further needed is the ability to share intermediate results and to most efficiently eliminate redundant computations.

BRIEF SUMMARY OF THE INVENTION

A computationally efficient and latency-minimized method of data acquisition and reconstruction for use with a Magnetic Resonance Imaging (MRI) system comprises traversing acquired k-space data in a plurality of segments and computing sub-images for each of the segments. Thereafter, the sub-images are incrementally summed to form intermediate images for use in monitoring and diagnosis in said MRI system.

Another computationally efficient method of data acquisition and reconstruction comprises equivalently evaluating a Fourier transform of acquired k-space data substantially immediately after data acquisition and incrementally reconstructing an image with the equivalently evaluated Fourier transform for the respective view.

BRIEF DESCRIPTION OF THE DRAWINGS

The features and advantages of the present invention will become apparent from the following detailed description of the invention when read with the accompanying drawings in which.

DETAILED DESCRIPTION OF INVENTION

Figure 1:
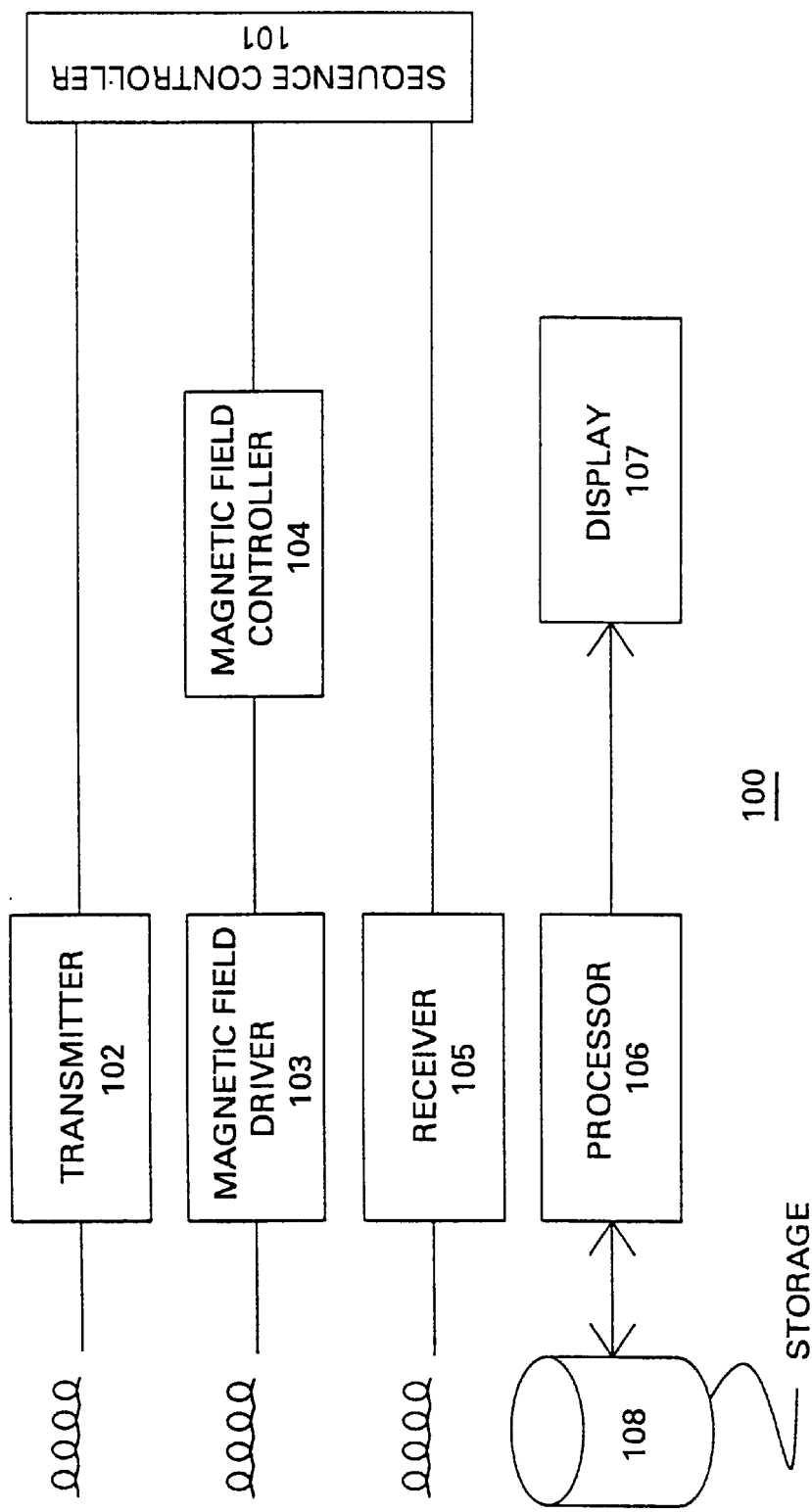
FIG. 1 is a block diagram of a Magnetic Resonance Imaging (MRI) system to which embodiments of the present invention are applicable.

Referring to FIG. 1, there is shown a block diagram of a magnetic resonance imaging (MRI) system for which embodiments of the present invention are applicable. The MRI system 100 comprises a sequence controller 101 for controlling various components of the system, as is well-known, for detecting magnetic resonance signals from the part of an object being imaged; a transmitter 102 for generating an radio frequency (RF) pulse to cause resonance; a magnetic field driver 103 for driving a field gradient in a known manner; a magnetic field controller 104 for controlling the magnetic field; a receiver 105 for receiving and detecting magnetic resonance signals generated from the object; a processor 106 for performing image reconstruction and various calculations for system operation; a display 107 for displaying images; and a peripheral memory device 108 for storing detected signal data and reconstructed k-space data.

As is well-known, within the processor there is memory for storing measured data and reconstructed images. The memory is sufficient to store the whole of N-dimensional measured data as well as reconstructed data. Two-dimensional data (N×M) is stored in memory. The embodiments of the invention will be discussed hereinafter in two-dimensions (2D), however it is appreciated that one skilled in the art can readily generalize equations and embodiments to higher dimensions.

In a well-known manner, an MR image is constructed from the image or k-space data corresponding to a predetermined plurality of applications of a MRI pulse sequence initiated by a RF pulse such as from transmitter 102 of FIG. 1. The image is updated by collecting image or k-space data from repetitive MRI pulse seqences. An MR image is reconstructed by performing a series of Fourier transforms along a set of orthogonal directions in k-space.

The known technique of Cartesian k-space sampling and image reconstruction from a sliding window of the most recent full set of phase encodes requires the evaluation of the following FFT:

$$g(m,n) = \lfloor IDFT_{M \times N-point}\{G(k_x, k_y); k_x = 0, 1, \ldots, (M-1), \quad (1)$$

$$(k_y = 0, 1, \ldots, (N-1)\}\rfloor_{evaluated\ at\ (m,n)}$$

$$= \frac{1}{N}\sum_{k_y=0}^{N-1}\left(\frac{1}{M}\sum_{k_x=0}^{M-1}G(k_x,k_y)e^{j\frac{2\pi}{M}k_x m}\right)e^{j\frac{2\pi}{N}k_y n}$$

where G and g denote, respectively, data sampled at a set of k-space grid points and the reconstructed image. The fast Fourier transform (FFT) is often implemented in the form of cascaded one-dimensional FFT's. For example, N M-point kx-direction FFT's are followed by M N-point ky-direction FFT's. A particularly efficient method calculates each kx-direction FFT immediately after acquiring a set of evenly spaced samples on a ky=constant line. i.e., a view. Efficiency as used herein refers to reducing or simplifying operations. Computational efficiency refers to reducing or simplifying computations.

Based on the mathematical properties of Equation (1) and with further derivations, Equation (1) is equivalently evaluated as:

$$g(m,n) = \frac{1}{N}\sum_{k_y=0}^{N-1}\left(\frac{1}{M}\sum_{k_x=0}^{M-1}G(k_x,k_y)e^{j\frac{2\pi}{M}k_x m}\right)e^{j\frac{2\pi}{N}k_y n} \quad (2)$$

$$= \sum_{l=0}^{L-1}\left[\frac{L}{N}\sum_{q=0}^{\frac{N}{L}-1}\left(\frac{1}{M}\sum_{k_x=0}^{M-1}G(k_x,qL+l)e^{j\frac{2\pi}{M}k_x m}\right)e^{j\frac{2\pi}{N}qn}\right]\frac{1}{L}e^{j\frac{2\pi}{N}nl}$$

$$= \tilde{g}_0(m,n)\frac{1}{L}e^{j\frac{2\pi}{N}n0} + \tilde{g}_1(m,n)\frac{1}{L}e^{j\frac{2\pi}{N}nl} + \ldots +$$

$$\tilde{g}_{L-1}(m,n)\frac{1}{L}e^{j\frac{2\pi}{N}n(L-1)}$$

where both L and N/L are integers, and for l=0, 1, . . . , L−1, $$\tilde{g}_l(m,n) = [L\text{-fold replication}\{IDFT_{M \times N/L-point}\{G(k_x, qL+l);$$

$$k_x=0,1,\ldots,(M-1), q=0,1,\ldots,(N/L-1)\}\}]_{evaluated\ at\ (m,n)} \quad (3)$$

The derivation indicates that an M-by-N FFT is equivalently calculated by forming a weighted sum of smaller-sized Fourier transforms (i.e., L M-by-N/L FFT's). Each of these smaller sized FFT's acts on a down-sampled input data set and generates an aliased version of the M-by-N FFT result. Advantageously, the weighting and summation effectively unfolds the aliased components and synthesizes an image identical to what would be obtained by applying a full-size FFT reconstruction.

An embodiment of a computationally efficient method of data acquisition and reconstruction comprises equivalently evaluating a Fourier transform in accordance with Equation (2) for a given view group of k-space data approximately immediately after acquiring data for the view group and incrementally reconstructing an image with the equivalently evaluated Fourier transform. The computations occur during data acquisition. Thus, reconstruction computation occurs "on-the-fly", that is it is initiated during the time of data acquisition by the MR scanner. Further, in this embodiment, each view group of acquired data is similarly reconstructed and incrementally combined to reconstruct a final image of the object during k-space data acquisition.

Figure 2:
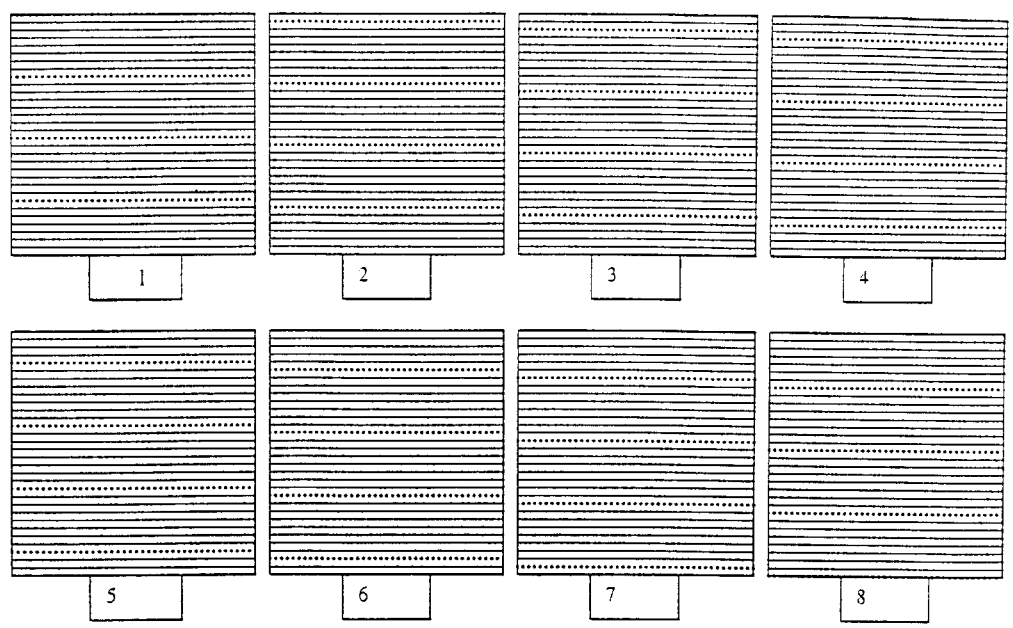
FIG. 2 is an illustration of view groups of k-space data for which embodiments of the present invention are applicable.

In a further embodiment, particularly applicable to MR fluoroscopy, a computationally efficient method of data acquisition and reconstruction for a frame of k-space data is performed to cut down computation redundancy and reconstruction latency in sliding window reconstruction. In this further embodiment, k-space is scanned with a devised scheme and sliding-window reconstruction is performed based on Equation (2). Specifically, a complete traversing of the k-space divided into L sequential segments, each segmented traverse acquiring a view group that represents an L-fold coarser sampling in the phase encoding direction. For N=32 and L=8, FIG. 2 illustrates an example case where 32 views are segmented into 8 view groups. The imaging pulse sequence repeatedly executes the traversing steps to acquire view groups according to a predetermined order that is selected by an operator of the MRI system, e.g., a sequential order of 1-2-3-4-5-6-7-8-1-2-3-4-5-6-7-8-. . . or an arbitrary order of 1-4-6-3-8-2-7-5-1-4-6-3-8-2-7-5- . . . . An M-by-N/L FFT of each view group immediately following its acquisition produces a sub-image that is further replicated and weighted to form a component image. As data are acquired and intermediate images (i.e., sub-images and component images) are continuously reconstructed, final fluoroscopic image frames are synthesized incrementally and on-the-fly, involving on the order of only MN complex-multiply-and-adds per step. Each fluoroscopic image frame is the result of summing L component images in the sliding window which is realized by adding new component image (s) and subtracting obsolete one(s).

Figure 3:
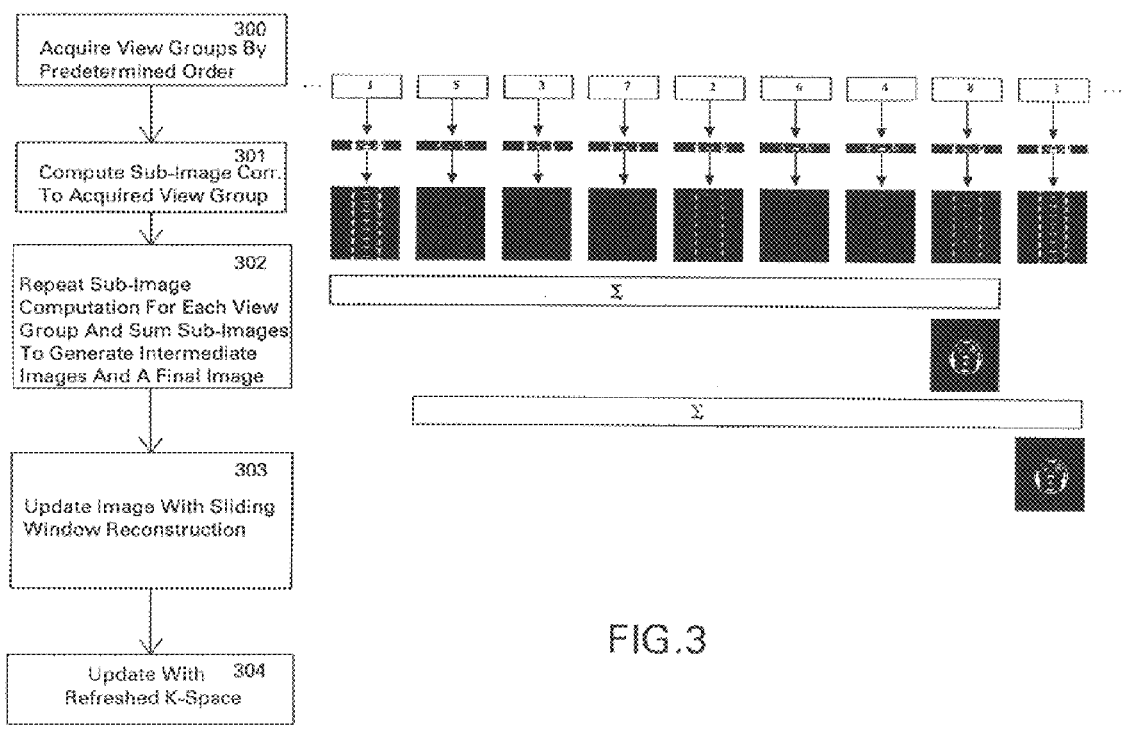
FIG. 3 is a flow diagram and illustration of an embodiment of the present invention.

Generating intermediate results provides a capability to steer the reconstruction process for producing higher quality final images and/or for intermediate images suitable to monitor the patient. Thus, these sub-images are useful for monitoring the patient during the scan and/or assist improving the quality of dynamic imaging, as the following embodiments shall elaborate. Equation (2) does not impose any constraint on view group acquisition order. In a further embodiment, view group acquisition is in accordance with a hierarchical order, which effects more frequent update on less dense k-space sampling and facilitates efficient reconstruction of additional fractional field of view (FOV) fluoroscopic images with improved temporal-resolution. FIG. 3 demonstrates the process of incrementally reconstructing fluoroscopic images using sequential ordering. FIG. 5 demonstrates the process of incrementally reconstructing fluoroscopic images using a hierarchical order. Where similar process steps appear in FIGS. 3 and 5, the reference numbers are the same.

Referring to FIG. 5, there is shown an illustration where for L=8, the ordering is selected as 1-5-3-7-2-6-4-8-1-5-3-7-2-6-4-8- . . . . The derivation for this ordering selection will be further discussed with reference to FIG. 4. Referring further to FIGS. 3 and 5, 8-fold coarser sampling is refreshed 8 times as frequently as the full sampling, 4-fold, 4 times, and so on.

Referring to FIGS. 3 and 5, a computationally efficient method of data acquisition and reconstruction comprises, at step 300 acquiring view groups in accordance with a predetermined order, for example sequentially as discussed above and shown in FIG. 3 or hierarchically as shown in FIG. 5 as 1-5-3-7-2-6-4-8-1-5-3-7-2-6-4-8 . . . . As the imaging sequence continuously acquires view groups according to the hierarchical order, M-by-N/L FFT of each view group, at step 301, a sub-image is computed in accordance with the previously discussed on-the-fly reconstruction (that is further replicated and weighted to reconstruct an image during data acquisition). At step 302, sub-image computation is repeated for each view group and the respective sub-images are incrementally summed to reconstruct intermediate component images until sub-images for all view groups have been computed. e. As shown in step 303, an updated final image is reconstructed by summing L intermediate component images in the sliding window. Referring further to FIG. 3, a representative set of sub-images, intermediate component images and final image are shown adjacent to each of the steps.

Referring to FIG. 5, if the acquisition of view groups is in accordance with a hierarchical order, further processing desirably occurs. As the imaging sequence continuously acquires view groups according to the hierarchical order, M-by-N/L FFT of each view group, at step 301, yields a sub-image for the group, which, at step 302, is further replicated and weighted to form a component image. As shown in step 303, an updated image is reconstructed by summing L component images in the sliding window. An additional step 304, image update is realized by adding new component image(s) and subtracting obsolete one(s). At step 304, an optional computation computes the sum of every p (an integer that satisfies $p=2^r$, $1 \leq r \leq \log L$) to generate fractional field-of-view (FOV) component images, thus reconstructing image frames with p-fold higher temporal resolution (but p-fold smaller y-direction field-of-view (FOV)). Referring further to FIG. 5, a representative set of sub-images, component images and final image are shown adjacent to each of the steps.

As in the previous MR fluoroscopy embodiment, use of the hierarchical order allows highly efficient construction of intermediate images (with fractional-FOV). These intermediate images in the present cardiac imaging application have relatively higher temporal resolution and thus tend to depict dynamics of interest with less temporal blurring. Further, as a way of minimizing degrading effects from motion that is not cardiac-synchronized (e.g., respiratory motion), these images may be cross-correlated with a reference kernel to determine the intervening motion and results be used to steering imaging by discarding-then-reacquiring non-cohesive component images.

When implementing the above embodiments, depending on the sequence timing and processor speed, L is selected such that $T_{compute}$ (total time needed to compute an M×N/L FFT, replicate and weight the result, and update a summation) is less or equal to $T_{traverse}/L$ (total time needed to acquire a view group). This leads to an effective reconstruction latency of $T_{compute}$ and a frame rate of $\sim 1/T_{compute}$, representing a factor of $\sim aL$ ($a=(1+(L-\log L)/\log MN)^{-1}$) improvement over existing sliding-window techniques that must at least re-compute N full-size $k_y$-direction FFT's for every image frame update. Due to increased number of complex-multiply-and-adds resulted from partitioning a full FFT however, for a given processor speed there may be a maximum L satisfying the $T_{compute} \leq T_{traverse}/L$ constraint. With the support of multiple processors or DSP chips that run in parallel, further latency reduction can be achieved.

The order with which the imaging sequence acquires the views in a view group is not constrained by the present technique and may be independently optimized based on MR physics considerations. When implementing with a multi-shot, interleaved, echo planar imaging pulse sequence for example, one may choose to employ a few shorts, each traversing a center-out trajectory, to fill each view group.

For every image to be reconstructed, the intermediate images reconstructed from the steps of coarse sampling each represents an aliased version of the image. Generating intermediate results provides a capability to steer the reconstruction process for producing higher quality final images and/or to produce intermediate images suitable to monitor the patient. Thus, these intermediate images are useful for monitoring the patient during the scan and/or assist improving the quality of dynamic imaging.

Figure 4:
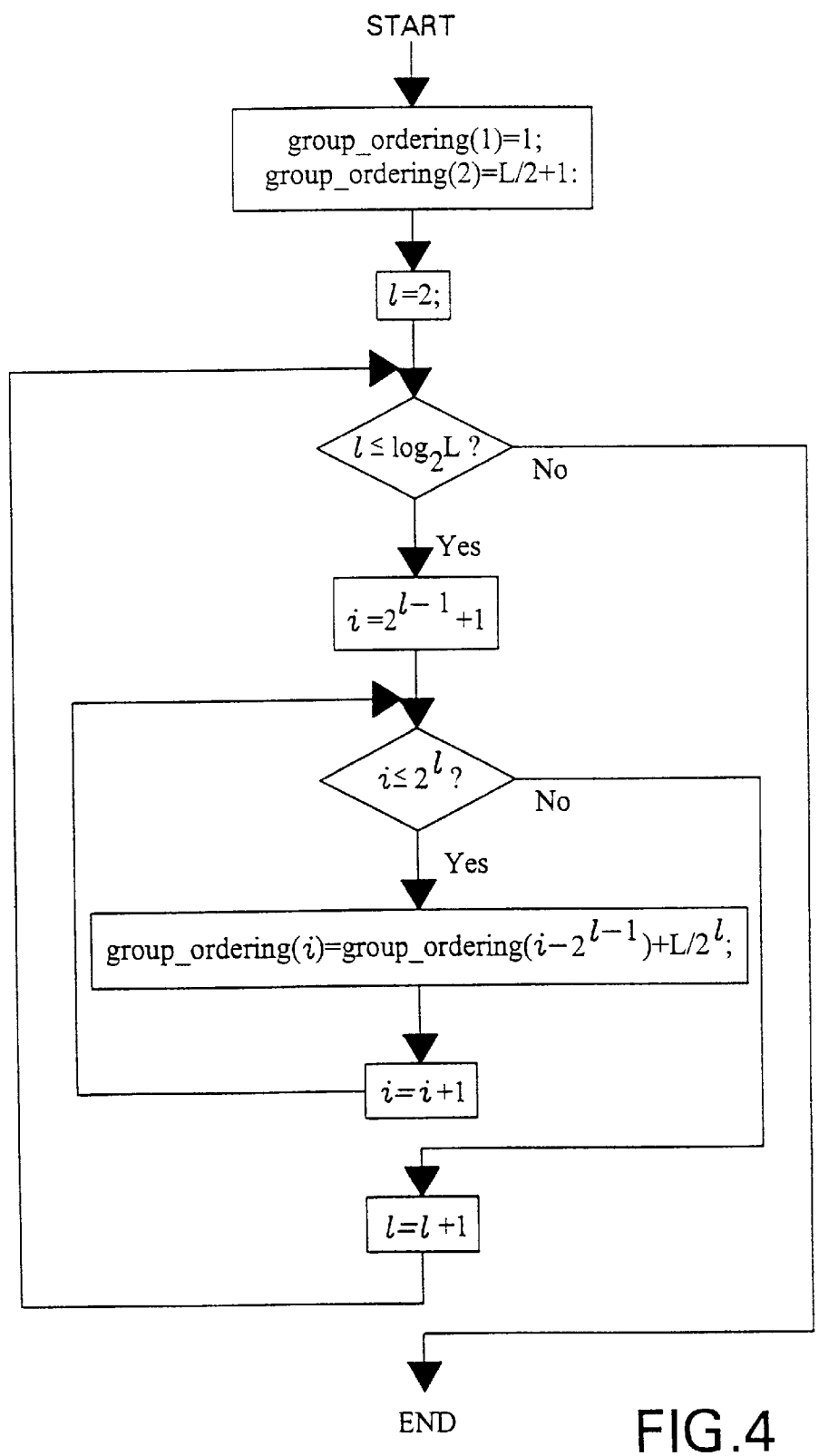
FIG. 4 is a flow diagram of a view group acquisition scheme to which embodiments of the present invention are applicable; and, FIG. 5 is a flow diagram and illustration of an embodiment of the present invention.

Referring to FIG. 4, there is shown a block diagram illustrating an algorithm for deriving a hierarchical view group acquisition ordering discussed with reference to FIG. 3. As the imaging sequence is required to acquire L view groups in a cyclic fashion, the relative ordering within a cycle is derived according to the algorithm, however which group with which group the imaging sequence starts is of no significance. The illustration therefore simply assumes the first acquired group is view group 1. Processed according to the flow of FIG. 4, the array "group ordering" stores the view group ordering upon completion (e.g., it stores 1-5-3-7-2-6-4-8 when L=8).

Compared to existing MR fluoroscopy techniques (with Cartesian k-space sampling and sliding-window image reconstruction) that compute full-size $k_y$- and/or $k_z$-direction Fourier transformation for every image update, the embodiments above synthesize a new image by summing partial Fourier transformation results. The partial results are faster to evaluate and shared between image updates. Sharing partial transformation results eliminates costly redundant computation and distributing transformation calculation into data acquisition periods further reduces reconstruction latency. It can be appreciated that implementation may be extended to 3D, for example in interleaved multi-slice imaging, or volumetric imaging (3D spatial encoding) with similar advantages.

Provided further is another embodiment that is applicable in cardiac-gated time-resolved imaging (cine). In this embodiment, (a) Pulse sequence executions proceed at a constant rate and acquire the same k-space view group repeatedly within a cardiac cycle.

(b) FFT performed immediately after the acquisition of each view group produces a sub-image sequence for the heart cycle. As soon as it becomes possible, temporal interpolation of the sequence generates a sequence of sub-image frames at the desired cardiac phases within the heart cycle. Replication and complex-weighting of each frame then gives rise to a sequence of component-images at the cardiac phases.

(c) The segmental k-space traversing pattern is altered upon the detection of a new cycle so that the view groups acquired vary between heart cycles according to the hierarchical order discussed previously (e.g., 1-5-3-7-2-6-4-8 for the example L=8 case). (a) and (b) are repeated for each cycle.

(d) Component-image sequences are added on-the-fly to incrementally reconstruct the final image sequence.

While the preferred embodiments of the present invention have been shown and described herein, it will be obvious that such embodiments are provided by way of example only. Numerous variations, changes and substitutions will occur to those of skill in the art without departing from the invention herein. Accordingly, it is intended that the invention be limited only by the spirit and scope of the appended claims.

What is claimed is:

1. A computationally efficient and latency-minimized method of data aquisition and reconstruction for use with a Magnetic Resonance Imaging (MRI) system comprising:

equivalently evaluating a Fourier transform of acquired k-space data by performing a smaller-sized Fourier transform for each of a plurality of view groups of said k-space data, each respective equivalent evaluation of said Fourier transform being performed substantially immediately after acquiring data for each of said respective view groups; and, incrementally reconstructing an image using a weighted sum of said smaller-sized Fourier transforms.

2. The method of claim 1 wherein a view comprises a set of evenly spaced samples of k-space data along a selected direction in k-space and said view groups comprise a plurality of said views.

3. The method of claim 1 further comprising incrementally reconstructing said plurality of equivalent evaluations to generate a final image upon completion of said equivalent evaluated Fourier transforms for said plurality of views.

4. The method of claim 3 wherein said respective equivalent evaluations comprises performing a smaller-sized Fourier transform on each of said view groups and further said incremental reconstruction is a weighted sum of said smaller-sized Fourier transforms.

5. The method of claim 1 wherein an M-by-N Fourier transform is equivalently calculated by forming a weighted sum of smaller-sized Fourier transforms calculated according to:

$$g(m,n) = \frac{1}{N}\sum_{k_y=0}^{N-1}\left(\frac{1}{M}\sum_{k_x=0}^{M-1}G(k_x,k_y)e^{j\frac{2\pi}{M}k_x m}\right)e^{j\frac{2\pi}{N}k_y n}$$

$$= \sum_{l=0}^{L-1}\left(\frac{L}{N}\sum_{q=0}^{\frac{N}{L}-1}\left(\frac{1}{M}\sum_{k_x=0}^{M-1}G(k_x,qL+l)e^{j\frac{2\pi}{M}k_x m}\right)e^{j\frac{2\pi}{N}qn}\right)\frac{1}{L}e^{j\frac{2\pi}{N}nl}$$

$$= \tilde{g}_0(m,n)\frac{1}{L}e^{j\frac{2\pi}{N}n0} + \tilde{g}_1(m,n)\frac{1}{L}e^{j\frac{2\pi}{N}n1} + \ldots +$$

$$\tilde{g}_{L-1}(m,n)\frac{1}{L}e^{j\frac{2\pi}{N}n(L-1)}$$

where both g represents a reconstructed image, L and N/L are integers, and for l=0, 1, . . . , L−1, and $$\tilde{g}_l(m,n) = [L - \text{fold replication}\{IDFT_{M \times N/L-point}\{G(k_x, qL+l);$$

$$k_x = 0, 1, \ldots, (M-1), \ q = 0, 1, \ldots, (N/L-1)\}\}]_{evaluated\ at(m,n)}$$

6. A computationally efficient and latency-minimized method of data acquisition and reconstruction of data for use with a Magnetic Resonance Imaging (MRI) system comprising:

traversing acquired k-space data in a plurality of segements according to a predetermined order, said segements defining respective view groups, each of said view groups comprising respective pluralities of views within said k-space;

computing a plurality of intermediate images incrementally from respective sub-images for each of said view groups, said computing comprising:

performing respective smaller-sized _Fourier transforms on each respective view group upon completion of data acquisition for said respective view group, said step of performing generating a respective sub-image for each of said respective view groups;

continuously summing said smaller-sized Fourier _transforms to combine said respective sub-images corresponding to said respective view groups approximately immediately after computing each of said respective sub-images to generate a plurality of intermediate images for use in monitoring and diagnosis in said MRI system.

7. The method of claim 6 further comprising generating a final image incrementally upon completion of said sub-image computation for each of said respective view groups.

8. The method of claim 6 wherein said predetermined order is sequential.

9. The method of claim 6 wherein said predetermined order is hierarchical.

* * * * *